(12) United States Patent
Jouffrey et al.

(10) Patent No.: US 6,392,228 B1
(45) Date of Patent: May 21, 2002

(54) ENERGY FILTER, TRANSMISSION ELECTRON MICROSCOPE AND ASSOCIATED METHOD FOR FILTERING ENERGY

(75) Inventors: Bernard Jouffrey, Paris; Cécile Souche, Versailles, both of (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 09/254,705

(22) PCT Filed: Sep. 3, 1997

(86) PCT No.: PCT/FR97/01555

§ 371 Date: Jun. 2, 1999

§ 102(e) Date: Jun. 2, 1999

(87) PCT Pub. No.: WO98/11593

PCT Pub. Date: Mar. 19, 1998

(30) Foreign Application Priority Data

Sep. 12, 1996 (FR) .............................. 96 11146

(51) Int. Cl.[7] .......................... H01J 40/00; H01J 47/00; H01J 37/05; H01J 37/26
(52) U.S. Cl. ................. 250/305; 250/311; 250/396 ML
(58) Field of Search ................................ 250/305, 311, 250/396 ML (56) References Cited

U.S. PATENT DOCUMENTS 4,812,652 A * 3/1989 Egle et al. .................. 250/311
5,336,885 A * 8/1994 Rose et al. .................. 250/305

FOREIGN PATENT DOCUMENTS

EP          0538938          4/1993

OTHER PUBLICATIONS

Uhlemann et al., "The Mandoline Filter—a New High Performance Imaging Filter for Sub–eV EFTEM", *Optik*, Stuttgart, Germany, Jun. 1994, vol. 96, No. 4, pp. 163–178.

Jouffrey, "Energy Loss Spectroscopy for Transmission Electron Microscopy", *Electron Microscopy in Materials Science*, World Scientific, 1991, pp. 363–368.

Rose et al., "Electron Optics of Imaging Energy Filters", *Energy Filtering Transmission Electron Microscopy*, Springer, 1995, pp. 43–55.

* cited by examiner

*Primary Examiner*—Bruce Anderson
(74) *Attorney, Agent, or Firm*—Greenblum & Bernstein, P.L.C.

(57) ABSTRACT

An energy filter receiving an electronic beam oriented along an optical axis. The filter includes a deflecting system which deviates in a dispersion plane not including the optical axis the received beam and a dispersing system which guides the beam sent by the deflecting system on an optical path inscribed in the dispersion plane and returning to the deflecting system. The deflecting system brings back in alignment with the optical axis the beam coming from the dispersing system. The deflecting system consists of a single element ensuring the inverse deviations of the beam whether outgoing or incoming. The invention is useful for transmission electron microscope.

12 Claims, 4 Drawing Sheets

ENERGY FILTER, TRANSMISSION ELECTRON MICROSCOPE AND ASSOCIATED METHOD FOR FILTERING ENERGY

CROSS-REFERENCE TO RELATED APPLICATIONS

The present application is a National Stage Application of International Application No. PCT/FR97/01555, filed Sep. 3, 1997. Further, the present application claims priority under 35 U.S.C. § 119 of French Patent Application No. 96/11146 filed on Sep. 12, 1996.

BACKGROUND OF THE INVENTION

1. Field of the Invention

This invention relates to an energy filter, also called velocity fitter, a transmission electron microscope and associated method for filtering energy 2. Description of Background and Relevant Information The invention is especially applicable to TEM (Transmission Electron Microscope) or to combined TEM-STEM (Scanning Transmission Electron Microscope) as well as to electron sources. It could be used for specific STEM microscopes.

A notable shortcoming of transmission electron microscopes, during the formation of images or of diffraction diagrams lies in the presence of chromatic aberrations. The latter, essentially due to faulty adjustable electromagnetic lenses of the microscope, are detrimental to contrast and to resolution. Chromatic aberrations can be reduced to a certain extent by applying an electron acceleration voltage that is both high and stable, and by observing very narrow samples.

However, a manner, particularly efficient and accurate, to improve the picture consists in eliminating a portion of the dispersed electrons in a non-elastic way using an energy filter.

The electrons having undergone a given loss of energy may also be employed to form the picture. By selecting a characteristic loss of a type of interaction or of a chemical element, we can obtain a filtered picture providing the mapping of this type of interaction or of this element.

Energy filtering also enables to form the picture of samples that would be too thick to be observed with a conventional transmission electron microscope.

An energy filter usually comprises spatial dispersion means for the electrons of the beam transmitted by the sample in relation to their energy, as well as a filtering slot enabling selection of an energy window. Besides filtering pictures or diffraction diagrams, energy filters are also employed for spectral analysis of energy losses. Energy filters can be installed in an electron microscope either inside the column of the microscope as an integral part of the instrument, or as an accessory below the visualisation screen. We shall find recent reports on several types of filters known in the articles by Bernard Jouffrey: <<Energy loss spectroscopy for transmission electron microscopy>> in Electron Microscopy in Materials Science, World Scientific, 1991, pp. 363–368 and by Harald Rose and Dieter Krahl: <<Electron optics of imaging energy filters>>, in Energy Filtering Transmission Electron Microscopy, Springer, 1995, pp. 43–55.

For example, the article in the magazine Optik, vol. 96, no4, pp. 163–178 by Uhlemann and Rose, describes a mandolin-type magnetic energy filter.

A parameter determining energy filters is energy dispersion D, expressed in $\mu$m/eV: the greater this parameter, the greater the selective power of the filter. In order to increase this dispersion D, various energy filters have been suggested, which cause the electrons of the beam to follow sufficiently long an optical path. Indeed, the dispersion D increases in particular with the length of the distance covered. Thus, in so-called $\Omega$ systems, while remaining in a fixed vertical plane, the beam propagating along the optical axis of the system is first deviated laterally, runs then along an optical path substantially parallel to the optical axis in the propagation direction, then is deviated towards the optical axis of the microscope before it is brought back in alignment with its initial direction.

The problem of the filters employed usually lies in their space requirements. Good dispersion D of the filter is indeed obtained by causing the electrons to run a distance over sufficient height. Vertical space requirements of the current filters range generally between 25 and 50 cm, for a dispersion D not exceeding 6 $\mu$m/eV.

The European patent application EP-40.538.938 suggested an electron beam instrument provided with an energy selective device. The latter causes the electrons to follow a path in a dispersion plane not containing the optical axis of the instrument. The vertical space requirements of the energy selective device are then reduced considerably for a given path length. In the specific embodiment disclosed in said document (FIG. 3), the energy filter comprises four beam deviating elements located in the dispersion plane, in the respective corners of a substantially rectangular figure which accepts two orthogonal planes of symmetry. The filter also comprises a first deflecting element deviating the beam of the optical axis of the microscope towards one of the deviating elements in the dispersion plane, and a second deflecting element deviating the beam coming from another deviating element in alignment with the optical axis.

SUMMARY OF THE INVENTION

The present invention relates to an energy filter capable of producing a wide dispersion D while exhibiting small vertical space requirements, notably increasing the dispersion properties of the filter disclosed in the document EP-0.538.938.

Another object of the invention is such a filter that can be used in conventional electron microscopy at high as well as at low voltage, stigmatic in the first order and affected by small aberrations only.

An additional object of the invention is an energy filter enabling high acceleration voltages.

The invention also relates to a transmission electron microscope provided with an energy filter generating wide dispersion D while exhibiting reasonable vertical space requirements, whereas this microscope can be notably of TEM or TEM-STEM type.

The invention also relates to an energy filtering method for an electron beam propagating along an optical axis, generating wide dispersion over small height along the optical axis, whereas this method can be applied to imaging, diffraction or spectrometry.

To this end, the invention relates to an energy filter receiving during operation an electron beam oriented along an optical axis in a propagation direction. The energy filter comprises:

a deflecting system that deviates in a dispersion plane not containing the optical axis, the beam received along the optical axis, and a dispersing system that guides the beam sent from the deflecting system on an optical path inscribed in the dispersion plane and returning to the deflecting system, and which generates a spatial dispersion of the electrons of the beam in relation to their energy, whereby the deflecting system brings back in alignment with the optical axis in the propagation direction the beam coming from the dispersing system.

According to the invention, the deflecting system comprises a single deflecting element ensuring inverse deviations of the beam, whether outgoing or incoming.

The energy filter according to the invention is different with respect to the existing systems in that it comprises a single deflecting element which, both, deviates the beam in a dispersion plane not including the optical axis and provides inverse deviations of the beam, whether outgoing or incoming. The vertical space requirements of this energy filter are therefore reduced considerably, while the latter remains particularly efficient, thus ensuring wide dispersion, small aberrations and other suitable optical properties.

The expressions <<deflecting system>> and <<dispersing system>> are generic expressions referring to the main technical effect of each of both systems. It is however extremely difficult to prevent the deflecting system from also causing dispersion, even if the latter is rather reduced. Similarly, the dispersing system generates deflections of the beam that follow energy dispersion.

The outgoing and incoming paths between the deflecting and dispersing systems are generally collinear, although slight discrepancies may appear in relation to one another.

The energy filter may thus provide particularly satisfactory results, notably as regards dispersion D.

The dispersing system should advantageously cause the electron beam to describe a closed curve not surrounding the optical axis.

Thus, the optical path covered by the beam in the deflection plane accepts convexity changes, notably favourable to the limitation of second order aberrations.

Preferably, the deflecting and dispersing systems are symmetrical with respect to a plane of symmetry containing the axis and with respect to the dispersion plane.

This configuration of the systems enables to obtain correct stigmatism and achromatism properties.

According to an advantageous embodiment of the energy filter, the dispersion plane is perpendicular to the optical axis.

According to a preferred embodiment of the dispersing system of the energy filter according to the invention, the latter comprises:

a first deviating element, which receives the beam coming from the deflecting system and which deviates the latter along an incoming direction, and a second deviating element, which receives from the first deviating element the beam along the incoming direction, causes it to follow a circular path in the dispersion plane and sends it back towards the first deviating element along an outgoing direction, whereas the first deviating element receives the beam coming from the second deviating element along the outgoing direction and deviates it towards the deflecting system.

It is then advantageous that the first deviating element is arranged between the axis and the second deviating element, whereas the second element comprises an external aperture in which the first element is installed partially.

In this particular embodiment, the dispersing system causes the electron beam to describe a closed curve not surrounding the optical axis.

According to a preferred embodiment of this lay-out:

the first element comprises a pair of polar parts parallel to the dispersion plane, each being hexagonal in shape and comprising a larger base perpendicular to the axis facing the deflecting system, two perpendicular sides connected at right angle to the larger base and parallel to the plane of symmetry, two oblique sides, respectively connected to the perpendicular sides and a smaller base; opposite and parallel to this larger base and connected to oblique sides, and, the second element comprises a pair of polar parts, respectively coplanar with the polar parts of the first element, each crown-shaped, comprising a centre arranged in the plane of symmetry and whose external aperture reaches inside the crown through a passage facing the smaller base of the polar parts of the first element and is delineated laterally by two sides, respectively, facing the oblique sides of the polar parts of the first element.

Advantageously, the deflecting and dispersing systems comprising magnetic sectors which comprise, each, a pair of opposite polar parts, separated by an air-gap, connected to actuation and control means in order to create in each air-gap a requested magnetic field, whereby the magnetic fields are uniform in each air-gap.

The invention also relates to a transmission electron microscope provided with an energy filter according to the invention.

The invention also relates to a method for energy filtering of an electron beam propagating along an optical axis in a propagation direction. In this method:

the beam is guided on an optical path substantially inscribed in a dispersion plane not including the optical axis in order to generate dispersion of the beam electrons in relation to their energy, the beam is re-directed in alignment with the axis in the propagation direction, and an energy window is selected spatially.

According to the invention, the beam is caused to follow in the dispersion plane incoming and outgoing paths which are collinear as well as of opposite directions.

BRIEF DESCRIPTION OF THE DRAWINGS

This invention will be understood better when reading the description below of an embodiment of an electron microscope and of an energy filter according to the invention, given for exemplification purposes and not limiting in any ways, with reference to the appended drawings, on which.

DETAILED DESCRIPTION OF THE INVENTION

Figure 1:
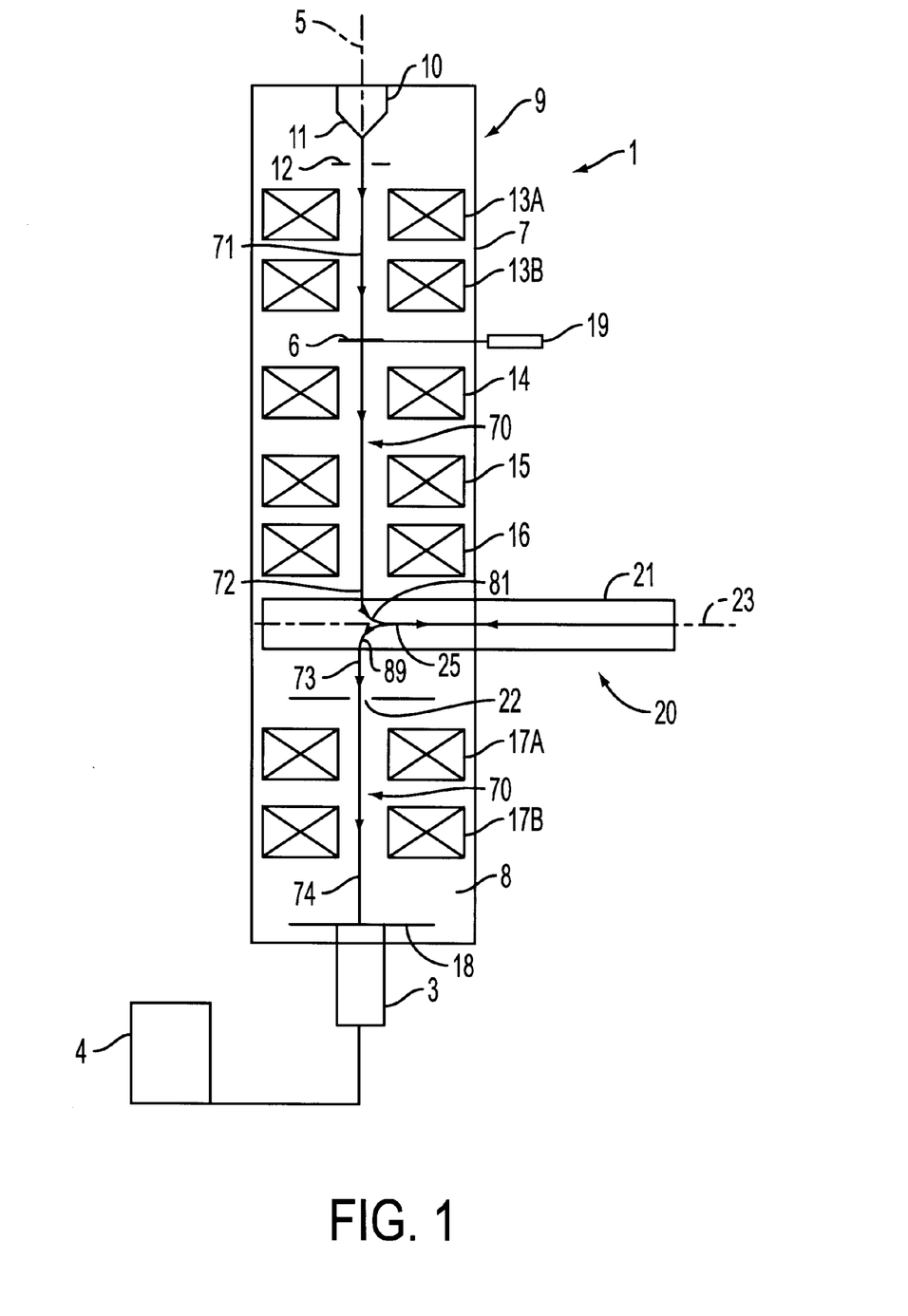
FIG. 1 is a schematic representation of a longitudinal section of a transmission electron microscope according to the invention.

A transmission electron microscope 1, such as represented in FIG. 1, comprises conventionally a column 7 constructed around an optical axis 5, an acquisition unit 3, a processing unit 4, a vacuum pump as well as electronic power supply and a control mechanism.

A transmission electron microscope 1, such as represented on FIG. 1, comprises conventionally a column 7 constructed around an optical axis 5, an acquisition unit 3, a processing unit 4, a vacuum pump as well as electronic power supply and control means.

The column 7 of the microscope 1 comprises upstream an electron gun 9, having an electron source 10, a cathode 11 and an anode 12. An acceleration voltage V applied between the cathode 11 and the anode 12 enables to extract electrons at very high speed. The acceleration voltage V ranges normally from 80 kV to 300 kV, but some instruments operate at lower or higher voltages.

Assuming that the column 7 is vertical, the following elements can be found in succession from top to bottom in the column 7: a first and a second sets of condensing lenses 13A and 13B, a sample-holder 19, a set of objective lenses 14, a set of diffraction lenses 15, a set of intermediate lenses 16, a first and a second sets of projection lenses 17A and 17B and a fluorescent screen 18 in the lower section of the column 7. Such an assembly is suitable to imaging processes since an enlarged picture of a sample 6 placed on the sample-holder 19 is displayed on the screen 18. It is also suitable to the diffraction or to the execution of a fine probe, which may be fixed or not.

The lenses 13–17 are variable focus electromagnetic lenses for which the current is caused to vary in their power supply coils. The electronic mechanism supplies the lenses 13–17 so that they may be able of focusing or deviating the electron beams, as well as the high voltage generator of the electron gun 9.

Other lenses, not represented by reasons of clarity, may be advantageously added to the column 7.

An energy filter 20 is interposed between the sets of lenses 16 and 17A. This filter 20 comprises a dispersing mechanism 21, which disperses spatially the electrons of a beam in relation to their energy, and a slot 22 downstream of the dispersing mechanism 21, which selects an energy window in the beam going through the former. In FIG. 1, energy dispersion takes place essentially in the first order in a plane perpendicular to the plane of the sheet whereby the slot 22 is open in a direction perpendicular to the plane of the sheet The slot 22 is preferably adjustable in width and in position, in order to adjust the energy window as well as regards the average energy on which it is centered as regards its width.

The lower section of the column 7 forms a projection chamber 8.

Conventionally, it is necessary to impose high vacuum inside the column 7 and the energy filter 20, whereby this vacuum is typically in the order of 2.5× $10^{-5}$ Pa.

The processing unit 4, connected to the screen 18, makes it possible to obtain precise information on the image formed on this screen 18. The microscope 1 enables measurement of the intensity I received by the screen 18 for a given energy loss E of an electron beam, and to visualize and store a corresponding spectrum, using the processing unit 4. The energy filter 20 of the electron microscope 1 of the example may therefore have a double application: filtering the image formed on the screen 18 or analysis of the sample 6 by obtaining an energy loss spectrum.

In operation, the sample 6 suitably prepared is placed on the sample-holder 19. An electron beam 70, sent by the electron gun 9 along the optical axis 5 reaches the sample 6 in the form of an incident beam 71 after passing through the sets of condensing lenses 13A and 13B. The beam goes through the sample 6 and becomes a transmitted beam 72 which goes through the sets of objective lenses 14, of diffraction lenses 15 and of intermediate lenses 16, and is subject to energy dispersion in the dispersing mechanism 21. The beam 70 then takes on the shape of a dispersed beam 73 at the outgoing of the dispersing mechanism 21, whereas this dispersed beam 73 is aligned with the optical axis 5. It is then filtered through the slot 22 and this beam, filtered 74, after passing through the sets of projection lenses 17A and 17B reaches the screen 18. Thus, an image or a filtered diffraction diagram or an energy loss spectrum of a given range of the sample 6 is obtained, which can be wide or narrow.

Figure 7A:
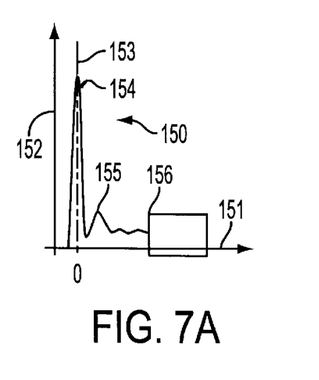
FIG. 7A shows an intensity curve I in relation to the energy loss E which can be obtained for a sample with the electron microscope of FIG. 1.
Figure 7B:
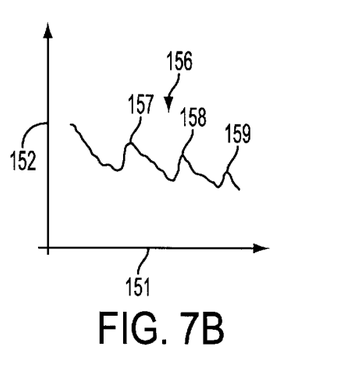
FIG. 7B shows an enlarged section of this curve.

The spectrum is represented in the form of a curve 150 of intensity I in relation to the energy loss E, as can be seen on FIG. 7A, whereby the energy loss E and the intensity I are respectively associated with the axes 151 and 152. In the case of a thin object, we can observe a high peak without any loss 154 centred on the axis 153 with zero loss, whereby most electrons are transmitted by the sample 6 without any energy loss E through elastic interaction with atomic cores. The loss-less peak 154 is generally followed by one or several secondary peaks 155, whereby their heights depend on the thickness of the sample 6, then by fluctuations admitting successive extremes and whose intensity I decreases gradually. The extremes 157–159 of the curve 150 (FIG. 7B) may also exhibit intensities I lower than that of the main peak 154 by several orders of magnitude and are therefore not visible unless longer counting takes place, thereby enabling to accumulate the electrons in a determined energy window 156.

Figure 5:
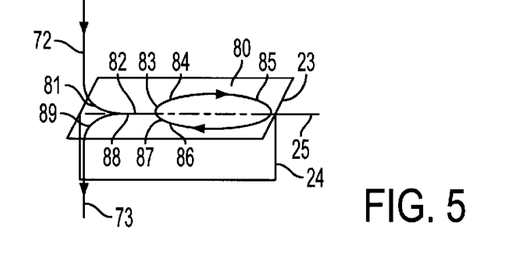
FIG. 5 represents schematically the optical path covered by the electron beam in the energy filter of FIGS. 2 to 4.

The dispersing mechanism 21 will now be described in more detail relative to its structure and function. These are essentially laid out on a dispersion plane 23 perpendicular to the optical axis 5 and therefore horizontal. All the elements of this dispersing mechanism 21 are symmetrical with respect to this dispersion plane 23. They are also symmetrical with respect to a plane of symmetry 24 containing the optical axis 5 (FIG. 5).

Figure 2:
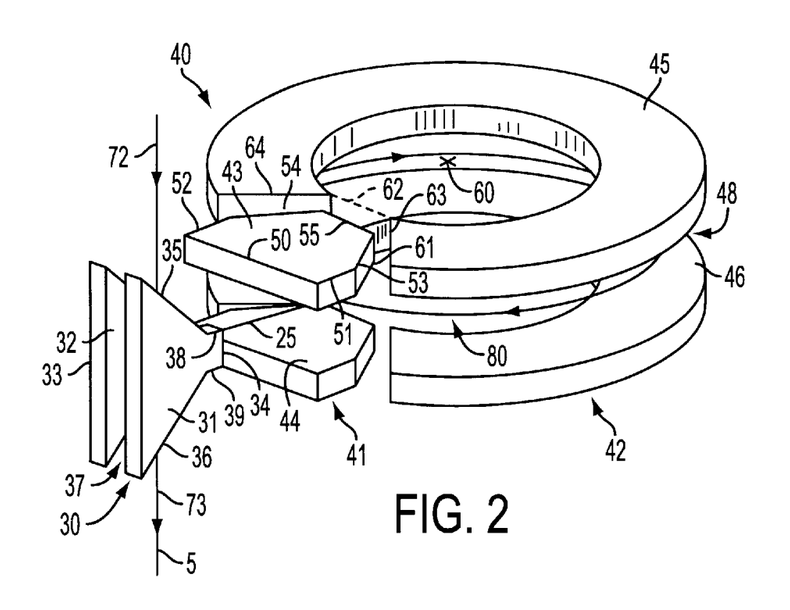
FIG. 2 shows in perspective an energy filter according to the invention employed in the electron microscope of FIG. 1.
Figure 3:
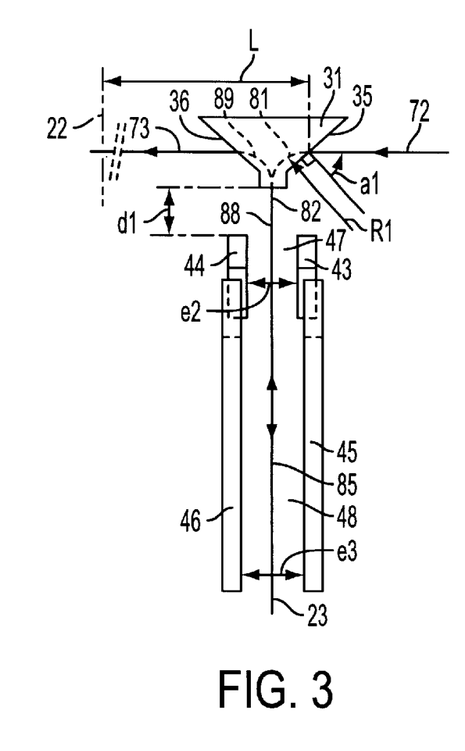
FIG. 3 is a side view of the energy filter of FIG. 2.
Figure 4:
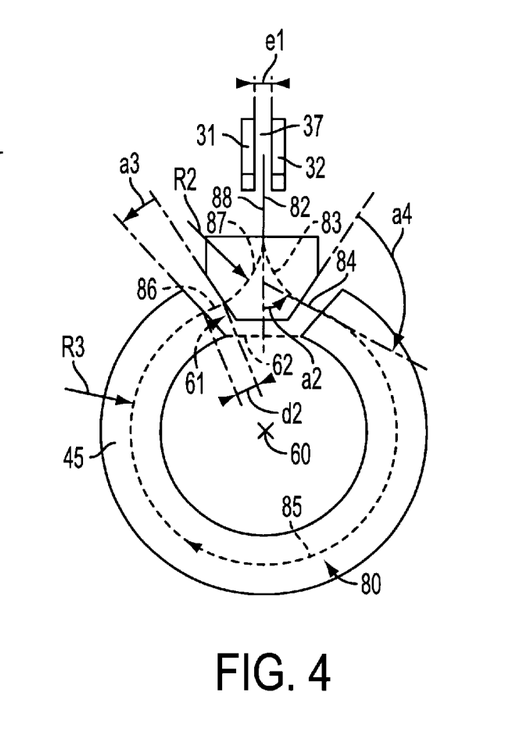
FIG. 4 is a top view of the energy filter of FIG. 2.

The dispersing mechanism 21, represented in FIGS. 2 to 4, comprise a deflecting system 30 and a dispersing system 40. The deflecting system 30 fulfills a double function: it deviates in the dispersion plane 23 the beam 72 transmitted along the optical axis 5 towards the dispersing system 40 and it re-deviates in alignment with the optical axis 5 in the initial propagation direction, the beam 70 coming from the dispersing system 40. The deflecting system 30 thus constitutes an interface between the optical axis and the dispersion plane 23 as regards the path followed by the beam 70.

The dispersing system 40, for its own part, guides the beam 70 sent by the deflecting system 30 on an optical path 80 inscribed in the dispersing plane 23 and sends it back to the deflecting system 30. The dispersing system 40 comprises a first and a second deviating elements 41 and 42, receiving successively the beam 70 coming from the deflecting system 30.

The deflecting system 30 and both deviating elements 41 and 42 constitute respectively three magnetic sectors of the dispersion mechanism 21.

In the particular embodiment shown, the deflecting system 30 comprises two polar parts or electromagnets 31 and 32 parallel to the plane of symmetry 24. Each part 31 and 32 is substantially triangular in shape, comprising a larger base 33 and two upper 35 and lower 36 oblique sides. This triangular shape is extended at the apex opposite to the larger base 33 by a rectangular protuberance comprising a smaller base 34 parallel and opposite to the larger base 33 and two sides 38 and 39 perpendicular to the smaller base 34 and linking the latter respectively to the oblique sides 35 and 36. The bases 33 and 34 are parallel to the axis 5 and arranged on either side of this axis 5.

The first deviating element 41 comprises two polar parts 43 and 44 parallel to the dispersion plane 23. Each of them is hexagonal in shape, comprising a larger base 50 perpendicular to the axis 5, facing the smaller bases 34 of the polar parts 31 and 32. It also comprises two perpendicular sides 51 and 52 connected at right angle with the larger base 50 and parallel to the plane of symmetry 24, two oblique sides 53 and 54 respectively connected to the perpendicular sides 51 and 52 and a smaller base 55 opposite and parallel to the larger base 50 and connected to the oblique sides 53 and 54. The upper 43 and lower 44 polar parts are separated by an air-gap 47.

The second deviating element 42 comprises, for its own part, two upper 45 and lower 46 polar parts, respectively coplanar with the polar parts 43 and 44 of the first deviating element 41. The first element 41 is provided between the axis 5 and the second element 42, whereas the polar parts 45 and 46 of the latter comprise external apertures 61 in which are respectively provided the polar parts 43 and 44 of the first element 41, partially. Each polar part 45 and 46 is shaped like an open crown, comprising a centre 60 located on the plane of symmetry 24. Its external aperture 61 reaches inside the crown via a passage 62 facing the smaller bases 55 and is delineated laterally by two sides 63 and 64 respectively facing the oblique sides 83 and 54 of the corresponding polar part 43, 44. The polar parts 45 and 46 are separated by an air-gap 48. The crown shape of the polar parts 45 and 46 enables to obtain a light structure and a good distribution of the magnetic field.

In operation, the electronic mechanism applies in each air-gap 37, 47, 48 of the magnetic sectors 30, 41, 42 a constant and preferably uniform magnetic field. The beam 72 transmitted by the sample 6 reaches the deflecting system 30 along the optical axis 5. It is then deviated between the polar parts 31 and 32 in order to be inscribed in the dispersion plane 23, following an incoming arc of circle 81 of radius RI. The beam 70 then covers the free space between the deflecting system 30 and the first deviating element 41, along an incoming segment 82 at the intersection of the dispersion plane 23 and of the plane of symmetry 24, whereas the incoming segment 82 defines a deflecting direction 25. All the optical path covered then by the beam 70 until it returns to the deflecting system 30 is included in the dispersion plane 23.

The beam 70 reaches after the incoming segment 82 the first deviating element 41 and describes there an arc of circle 83 inside the dispersing system 40, of radius R2. The beam 70 leaves the first element 41 through one of the oblique sides 54 along a direction forming with this side an angle a4. It covers then, between the oblique side 54 and the second deviating element 42, a first segment 84 inside the dispersing system 40.

The beam 70 then enters the second deviating element 42 via the side 64 of the aperture 61 facing the oblique side 54 and describes therein a circular path 85 centred on the centre 60 and of radius R3.

The rest of the path covered by the beam 70 follows the symmetry with respect to the plane of symmetry 24. Thus, the optical path followed by the beam 70 comprises successively a second inner segment 86 between the side 63 of the second element 42 and the oblique side 53 of the first element 41, an inner arc of circle 87 inside the first element 41, and an outgoing segment 88, superimposed on the incoming segment 82.

Having reached the deflecting system 30, the beam 70 is re-deviated to the axis 5 in the initial propagation direction, covering in the deflecting system 30 an outgoing arc of circle 89 symmetrical of the incoming one 81 with respect to the dispersion plane 23. It comes out, in alignment with the axis 5, in the form of the dispersed beam 73.

All the path portions 81–89 followed by the beam 70 make up the optical path 80 covered by the dispersion mechanism 21. This optical path 80 comprises mainly a closed curve 83–87 not including the optical axis 5, a linear portion 82 and 88 between the axis 5 and this closed curve as well as connections 81, 89 of this portion linear with the axis 5. The curve changes in the closed curve, i.e. changeovers between arcs of circle 83 and 85 on the one hand, and 85 and 87 on the other hand, exert a positive effect on the reduction of second order aberrations.

The lay-out of the incoming and outgoing segments 82 and 88 proves rather efficient in providing very satisfactory optical properties, notably a good dispersion D, if a satisfactory selection of the parameters of the filter 20 is provided.

The optical properties of the filter 20 depend mainly on nine parameters: the three radii R1, R2 and R3; the distance d1 between the deflecting system 30 and the first flexing element 41, and the distance d2 covered by the beam 70 between the first flexing element 41 and the second flexing element 42; the angle a1 defined for the deflecting system 30 between the normal to the upper oblique side 35 and the transmitted beam 72, the angle a2 defined for the first flexing element 41 as the deflection angle of this element, the angle a3 between one of the oblique sides 53, 54 of the first flexing element 42 and the side 63, 64 of the second flexing element 42, and the angle a4.

A particularly judicious choice of these parameters of the filter 20 is:

R1=2.70 cm, R2=5.40 cm, R3=9.98 cm; d1=3.51 cm, d2=1.5 cm;

a1=45.5°, a2=64.5°, a3=10°, a4=81.4°.

Other parameters involved are the widths e1, e2 and e3, respectively of the air-gaps 37, 47 and 48. These widths e1, e2, e3 have been selected in order to make a compromise between opposite needs: the smaller they are, the less significant the stray field, hence the lower the aberrations, but the more problems raised by opening the beam 70, notably in diffraction mode. The widths e1, e2 and e3 are traditionally comprised between 2 and 10 mm, advantageously in the order of 2 mm.

The length L is determined as the distance from the incoming point of the beam 72 transmitted in the deflecting system 30 and the position of the selection slot 22. For illustrative purposes, the dispersion D is respectively equal to 6 $\mu$m/eV, 8 $\mu$m/eV and 10 $\mu$m/eV for the lengths L, respectively 18.7 cm, 23.9 cm and 29 cm.

Figure 6A:
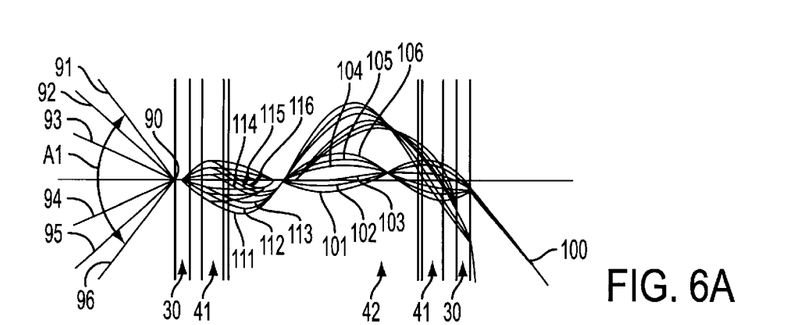
FIGS. 6A and 6B represent the paths followed by the electrons in the energy filter of FIGS. 2 to 4, respectively along a first and a second main section.
Figure 6B:
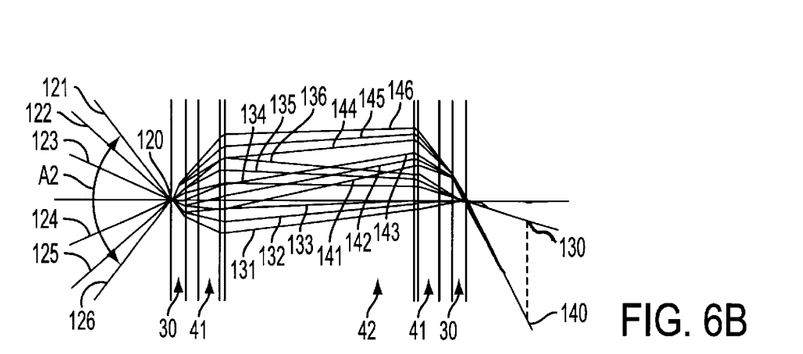

The energy dispersion of the beam 72 transmitted by the sample 6 can be materialised while considering various electron paths, as represented on FIGS. 6A and 6B. In this example, the widths e1, e2 and e3 of the air-gaps 37, 47 and 48 are equal to 6.5 mm, the acceleration voltage V is 200 kV and the dispersion 8 µm/eV. The beam 72 received by the filter 20 has a 15 mrad divergence.

The projections of certain paths of the beam 70 are interesting along two main sections. The first main section is associated with the follow-up of the beam 70 in the dispersion plane 23 whereas the second corresponds to the follow-up of the beam 70 in a plane perpendicular to the dispersion plane 23. The spaces and the angles are strongly emphasised on FIGS. 6A and 6B solely for clarification purposes. To simplify, let us assume that two families of electrons reach the filter 20, each corresponding to a set energy loss. These losses are respectively equal to 340 eV and 2400 eV.

In the first main section (FIGS. 6A), the electrons represented reach the deflecting system 30 along six distinct directions 91–96. The directions 91–96 have an angular aperture Al equal to the divergence of the beam equal to 15 mrad, and to each incident direction correspond two paths of electrons belonging respectively to both families. The paths cross each other at an incoming point 90 located in the deflecting system 30, whereby this incoming point 90 is the first convergence point or incoming cross-over. The paths along both families superimposed at the incoming point, come apart to form six paths 101–106 for the electrons of the first family and six other paths 111–116 for the electrons of the second family. After going through, in succession, the deflecting system 30, the first deviating element 41, the second deviating element 42, then again the first deviating element 41, the paths of the electrons pass the deflecting system 30 again and the paths 101–106 and 111–116 of both families join together to cross one another respectively at a first point 100 and at a second point, not represented, vertical to the first point 100, whereas these points are called outgoing cross-overs and located at the outgoing of the deflecting system 30.

A similar behaviour is observed in the second main section (FIG. 6B). Thus, the electrons of the beam 72 reach the deflecting system 30 along six directions 121–126 of angular aperture A2 equal to the aperture of the beam 72, i.e. 15 mrad. The electron paths join together at an incoming point 120 of first convergence, then both energy families, superimposed at incoming for each path, come apart, thus generating six electron paths 131–136 for the first family and six others 141–146 for the second family. The paths 131–136 and 141–146 cover, in succession, the deflecting system 30, the first deviating element 41, the second flexing element 141, again the first deviating element 41, then the deflecting system 30 and they then converge at two image points 130 and 140, vertical to one another, of the incoming point 120, respectively, of both families.

Figure 8:
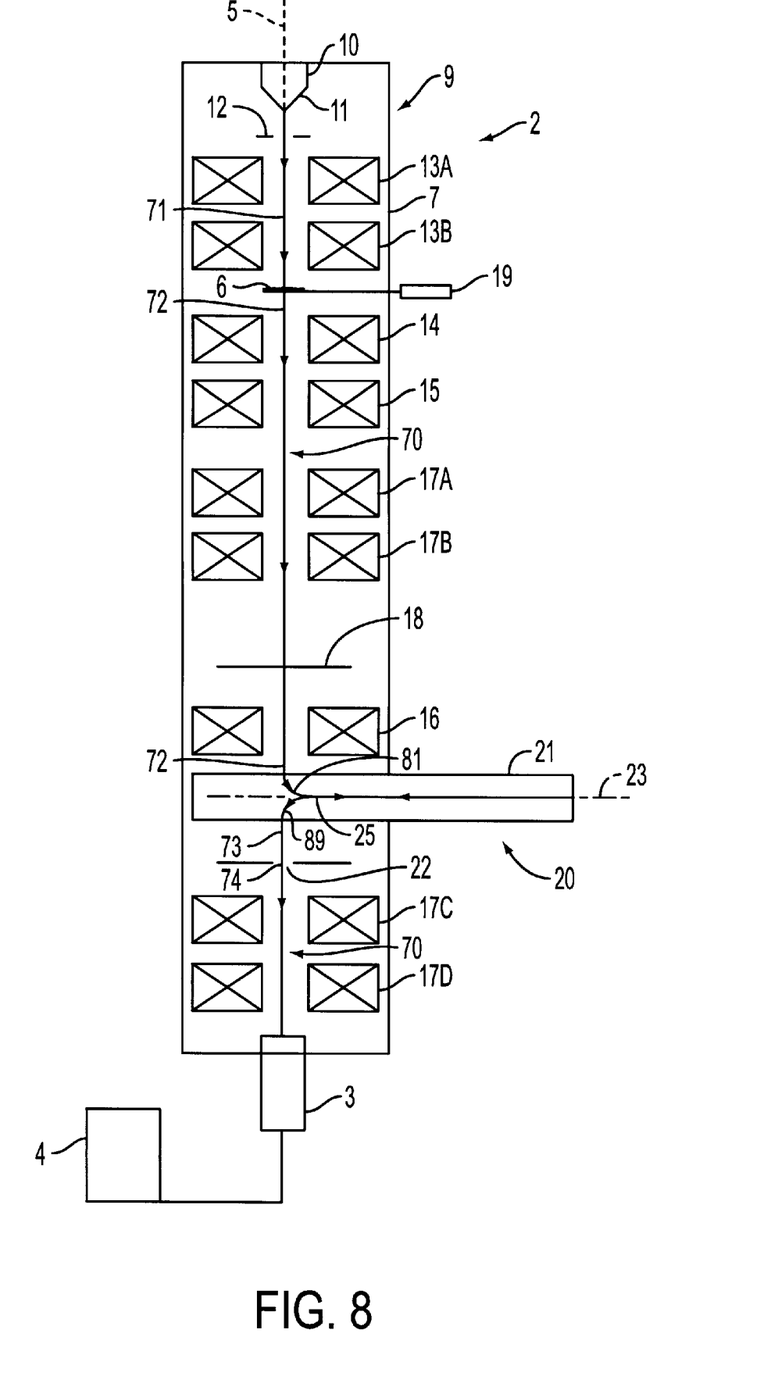
FIG. 8 is a schematic representation of a longitudinal section of another embodiment of the electron microscope of FIG. 1.

In another embodiment of the microscope 2 according to the invention, represented in FIG. 8, the filter 20 is provided in the lower section of the column 7 of a microscope 2. In FIG. 8, the elements identical to those of FIG. 1 are designated by the same references.

In this configuration, the following elements can be found in succession from top to bottom in the column 7: the sets of condensing lenses 13A and 13B, the sample-holder 19, the set of objective lenses 14, the system of diffraction lenses 15, the first and second sets of projection lenses 17A and 17B, the screen 18, the set of intermediate lenses 16, the filter 20 and a third and fourth sets of projection lenses 17C and 17D. The acquisition unit 3 is placed downstream of the column 7 and is connected to the processing unit 4. An advantage of this embodiment of the microscope 2 is that the device with filter 20 may simply be added below an existing microscope.

Among the interesting embodiments within the scope of the invention, the magnetic field applied between the upper 45 and lower 46 prisms of the second deviating element 42 may be non-uniform, but it may accept a constant gradient. This gradient is applied in order to focus the beam 70 between the prisms 45 and 46, in order to reduce the electron collisions on the polar parts and to thus diminish the losses of the beam 70.

It is quite obvious that the particular forms given to the deflecting and dispersing systems only constitute a particular embodiment and that any other embodiment is possible as long as the latter is covered by the set of claims. Notably, the dispersing system 40 may be such that it causes the electron beam 70 to describe a closed curve surrounding the optical axis 5. To do so, the dispersing system 40 is for instance composed of two deviating elements, one of which is located on a first side of the optical axis and the other on the is opposite side, whereby the first deviating element deviates the electrons towards the second deviating element which causes the former to cover an optical path of sufficient length to obtain the desirable dispersion D.

The description of a closed curve surrounding the optical axis 5 enables reduction of the space necessary for all the dispersion mechanisms 21, but has the shortcoming of increasing the aberrations of the second order since the path in the dispersion plane 23 is always described in the same direction.

According to the embodiment exposed, the deflecting system 30 receives the beam 72 transmitted along the angle of incidence al, preferably equal to 45.5°. Other embodiments than that shown are acceptable, providing they offer this same angle of incidence a1.

However, the deflecting system 30 may also be composed of polar parts 31 and 32 receiving the beam 72 transmitted at normal Incidence. In such a case, a multipolar optical system is placed at the incoming of the deflecting system 30, such as a quadripole or an octopole.

Generally speaking, the deflecting 30 and dispersing 40 systems must be designed so that the propagations of the beam 70 towards one another are collinear, or so that the deflecting system is formed of a single deflecting element.

Although the presentation of the invention is made for a transmission electron microscope or TEM, it is also suitable for a scanner transmission electron microscope or STEM or for a combined electron microscope.

What is claimed is:

1. An energy filter for receiving during operation an electron beam oriented along an optical axis in a propagation direction, the energy filter comprising:

a deflecting system which changes a direction of the electron beam to a direction along an incoming path that is in a dispersion plane, wherein the dispersion plane is oriented in a direction which is different than the optical axis, the electron beam being received along the optical axis; and a dispersing system which guides the electron beam that is sent from the deflecting system on an optical path which is inscribed in the dispersion plane and which returns to the deflecting system along an outgoing path that is collinear to an incoming path, the dispersion system generating a spatial dispersion of electrons of the electron beam in relation to their energy, whereby the deflecting system brings back in alignment with the optical axis, in a propagation direction, the electron beam coming from the dispersing system, wherein the incoming and outgoing paths are superimposed in opposite directions within the dispersion plane.

2. The energy filter of claim 1, wherein the dispersing system is adapted to cause the electron beam to describe a closed curve which is not surrounding the optical axis.

3. The energy filter of claim 1, wherein the deflecting and dispersing systems are arranged to be symmetrical with respect to each of a plane of symmetry containing the optical axis and the dispersion plane.

4. The energy filter of claim 1, wherein the dispersion plane is arranged to be perpendicular to the optical axis.

5. The energy filter of claim 1, wherein the dispersing system comprises:

a first deviating element which receives the electron beam coming from the deflecting system and which deviates the electron beam along an incoming direction; and a second deviating element which receives from the first deviating element the electron beam along the incoming direction, causes the electron beam to follow a circular path in the dispersion plane, and sends the electron beam back towards the first deviating element along an outgoing direction, wherein the first deviating element receives the electron beam coming from the second deviating element along the outgoing direction and deviates the electron beam towards the deflecting system.

6. The energy filter of claim 5, wherein the first deviating element is arranged between the optical axis and the second deviating element and wherein the second element comprises an external aperture which is adapted to at least partially receive the first element.

7. The energy filter of claim 5, further comprising:

a first element comprising a pair of polar parts arranged parallel to the dispersion plane, each polar part being six-sided in shape and comprising a first base which is arranged perpendicular to the optical axis and facing the deflecting system, two of the six sides being perpendicular sides oriented at right angle to the base and arranged parallel to the plane of symmetry, two other of the six sides being oblique sides;

a second element comprising a pair of polar parts which are arranged to be respectively coplanar with the polar parts of the first element, each of the polar parts being crown-shaped and comprising a center which is arranged in the plane of symmetry.

8. The energy filter of claim 1, wherein the deflecting and dispersing systems each comprise magnetic sectors, each magnetic sector including a pair of oppositely arranged polar parts which are separated by an air-gap.

9. The energy filter of claim 1, wherein the energy filter is adapted to be used with a transmission electron microscope.

10. A method for energy filtering of an electron beam propagating along an optical axis in a propagation direction, the method comprising:

guiding the electron beam from the optical axis to an optical path substantially inscribed in a dispersion plane which is oriented in a different direction than the optical axis in order to generate a dispersion of electrons of the electron beam in relation to their energy, whereby the electron beam is caused to enter the dispersion plane along an incoming path; and re-directing the electron beam into alignment with the optical axis in the propagation direction, whereby the electron beam is caused to leave the dispersion plane along an outgoing path which is collinear to the incoming path, wherein the incoming and outgoing paths are superimposed in opposite directions within the dispersion plane.

11. The method of claim 10, further comprising directing the electron beam through an energy window after the electron beam leaves the energy filter.

12. An energy filter for a transmission electron microscope that utilizes an electron beam traveling along an optical axis in a propagation direction, the energy filter comprising:

a deflecting system for changing the direction of the electron beam from the optical axis into an incoming path that is arranged in a dispersion plane, wherein the dispersion plane comprises a plane which is oriented in a direction which is different from the optical axis; and a dispersing system for guiding the electron beam after the electron beam passes through the deflecting system, whereby the dispersion system guides the electron beam on an optical path which is inscribed in the dispersion plane and returns the electron beam to the deflecting system along an outgoing path that is collinear to an incoming path;

the dispersion system generates a spatial dispersion of electrons of the electron beam in relation to their energy and brings back into alignment with the optical axis and in a propagation direction, the electron beam coming from the dispersing system, wherein the incoming and outgoing paths are superimposed in opposite directions within the dispersion plane.

* * * * *